US012707929B2

(12) United States Patent
Chen et al.

(10) Patent No.: US 12,707,929 B2
(45) Date of Patent: Aug. 11, 2026

(54) METHOD OF CLEANING A NOZZLE

(71) Applicant: TAIWAN SEMICONDUCTOR MANUFACTURING COMPANY, LTD., Hsinchu (TW)

(72) Inventors: Guan Jung Chen, Hsinchu (TW); Shi-Ming Wang, Hsinchu (TW); Chia-Hung Tsai, Hsinchu (TW); Yuan-Yu Feng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 232 days.

(21) Appl. No.: 18/347,961

(22) Filed: Jul. 6, 2023

(65) Prior Publication Data

US 2023/0352327 A1 Nov. 2, 2023

Related U.S. Application Data

(62) Division of application No. 16/204,781, filed on Nov. 29, 2018, now Pat. No. 11,699,609.

(Continued)

(51) Int. Cl.

*B08B 9/035* (2006.01)
*B08B 5/04* (2006.01)

(Continued)

(52) U.S. Cl.

CPC ............ *H10P 72/1924* (2026.01); *B08B 5/04* (2013.01); *B08B 9/035* (2013.01); *H10P 72/0604* (2026.01); *H10P 72/1926* (2026.01)

(58) Field of Classification Search

CPC .. B08B 9/035; B08B 1/12; B08B 5/04; H01L 21/67253; H01L 21/67389;

(Continued)

(56) References Cited

U.S. PATENT DOCUMENTS

| | | |
|---|---|---|
| 3,753,568 A | 8/1973 | Buck et al. |
| 4,340,897 A | 7/1982 | Miller |

(Continued)

FOREIGN PATENT DOCUMENTS

| | | | |
|---|---|---|---|
| EP | 3354354 A1 * | 8/2018 | ......... G01N 21/8851 |
| JP | H0352777 A * | 3/1991 | |
| JP | 2013131712 | 7/2013 | |

OTHER PUBLICATIONS

Machine translation of JPH03-52777A (Year: 1991).*

*Primary Examiner* — Douglas Lee

(74) *Attorney, Agent, or Firm* — Hauptman Ham, LLP

(57) ABSTRACT

A method of cleaning a nozzle of a gas supply system includes loading an apparatus including a carrier and an automated nozzle cleaning system in the carrier onto a load port containing a gas supply system. The automated nozzle cleaning system includes a first nozzle cleaning device, a second nozzle cleaning device and a monitoring device, and the carrier is positioned to enable a gas inlet of the carrier to be connected to a nozzle of the gas supply system. The method also includes vacuuming contaminant particles from the nozzle using the first nozzle cleaning device, mechanically removing the contaminant particles adhering to the nozzle off the nozzle using the second nozzle cleaning device, and measuring a level of the contaminant particles using the monitoring device.

20 Claims, 7 Drawing Sheets

Related U.S. Application Data

(60) Provisional application No. 62/739,075, filed on Sep. 28, 2018.

(51) Int. Cl.
*H10P 72/00* (2026.01)
*H10P 72/10* (2026.01)

(58) Field of Classification Search
CPC ......... H01L 21/67393; H01L 21/67046; B05B 15/52; B23K 9/328
See application file for complete search history.

(56) References Cited

U.S. PATENT DOCUMENTS

| | | | | |
|---|---|---|---|---|
| 5,238,503 | A | 8/1993 | Phenix et al. | |
| 5,330,577 | A | 7/1994 | Maeda et al. | |
| 6,248,177 | B1 | 6/2001 | Halbmaier | |
| 6,267,123 | B1 | 7/2001 | Yoshikawa et al. | |
| 6,368,776 | B1 * | 4/2002 | Harada | H01L 21/67109 430/327 |
| 7,021,323 | B1 | 4/2006 | Ishikawa et al. | |
| 2002/0029791 | A1 * | 3/2002 | Matsuoka | C23C 16/52 15/319 |
| 2009/0064760 | A1 * | 3/2009 | Moriya | H01L 21/67253 73/28.04 |
| 2014/0000757 | A1 | 1/2014 | Takahara et al. | |
| 2018/0015562 | A1 * | 1/2018 | Denzer | B05B 15/52 |
| 2018/0243882 | A1 * | 8/2018 | Lee | B24B 55/06 |

* cited by examiner 200
218
222
230
600

610
614
616
612
220
300
100

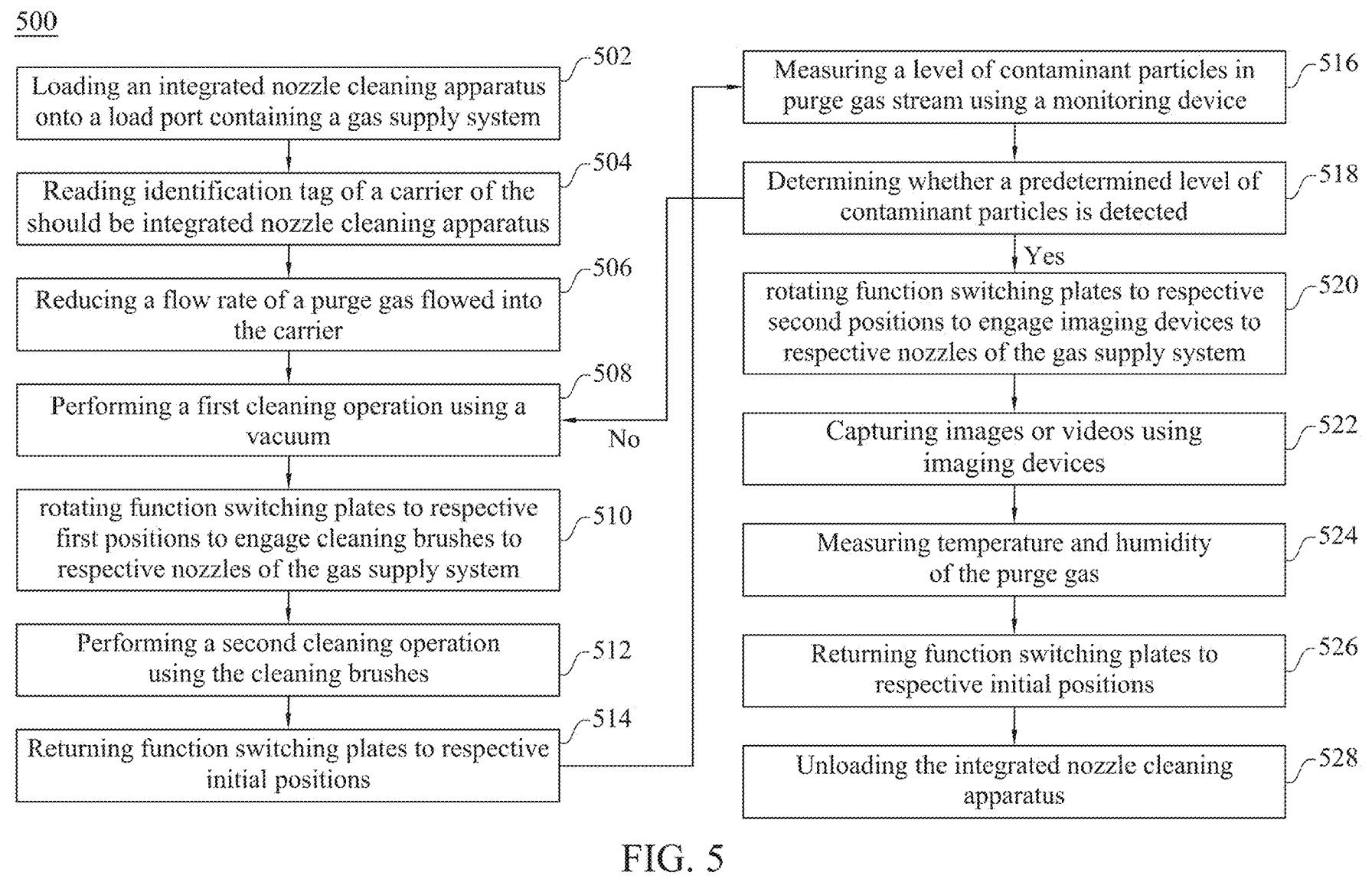

500

502 Loading an integrated nozzle cleaning apparatus onto a load port containing a gas supply system 504 Reading identification tag of a carrier of the should be integrated nozzle cleaning apparatus 506 Reducing a flow rate of a purge gas flowed into the carrier 508 Performing a first cleaning operation using a vacuum 510 rotating function switching plates to respective first positions to engage cleaning brushes to respective nozzles of the gas supply system 512 Performing a second cleaning operation using the cleaning brushes 514 Returning function switching plates to respective initial positions 516 Measuring a level of contaminant particles in purge gas stream using a monitoring device 518 Determining whether a predetermined level of contaminant particles is detected Yes No 520 rotating function switching plates to respective second positions to engage imaging devices to respective nozzles of the gas supply system 522 Capturing images or videos using imaging devices 524 Measuring temperature and humidity of the purge gas 526 Returning function switching plates to respective initial positions 528 Unloading the integrated nozzle cleaning apparatus

FIG. 5

METHOD OF CLEANING A NOZZLE

RELATED APPLICATIONS

This application is a divisional application of U.S. application Ser. No. 16/204,781, filed Nov. 29, 2018, now U.S. Pat. No. 11,699,609, issued Jul. 11, 2023, which claims priority to provisional Application No. 62/739,075, filed Sep. 28, 2018, the entireties of which are hereby incorporated by reference.

BACKGROUND

Wafer carriers, such as front opening unified pods (FOUPs), are specialized closed-type carriers designed to hold wafers in a controlled environment between processing steps. FOUPs provide environments with controlled airflow, pressure and particle content for wafers stored therein and thus help to isolate wafers from potential contamination during wafer storage and transportation. However, FOUPs can still be contaminated by gases from manufacturing processes or by chemical compounds emitted from the stored wafers in the FOUPs. Moisture, oxygen, and airborne molecular contaminants are common sources of defects and pattern failures in chip manufacturing. For example, the presence of humidity causes native oxide growth, corrosion, and film cracking of wafers in some instances. Furthermore, the presence of organic compounds leads to degradation of the electrical properties in circuits on wafers in some instances. Purging FOUPs with gas such as nitrogen or compressed dry air is widely used in the semiconductor industry to help eliminate undesirable contaminants.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flow chart of a method for automatically cleaning nozzles of a gas supply system using an integrated nozzle cleaning apparatus, in accordance with some embodiments.

DETAILED DESCRIPTION

Figure 1:
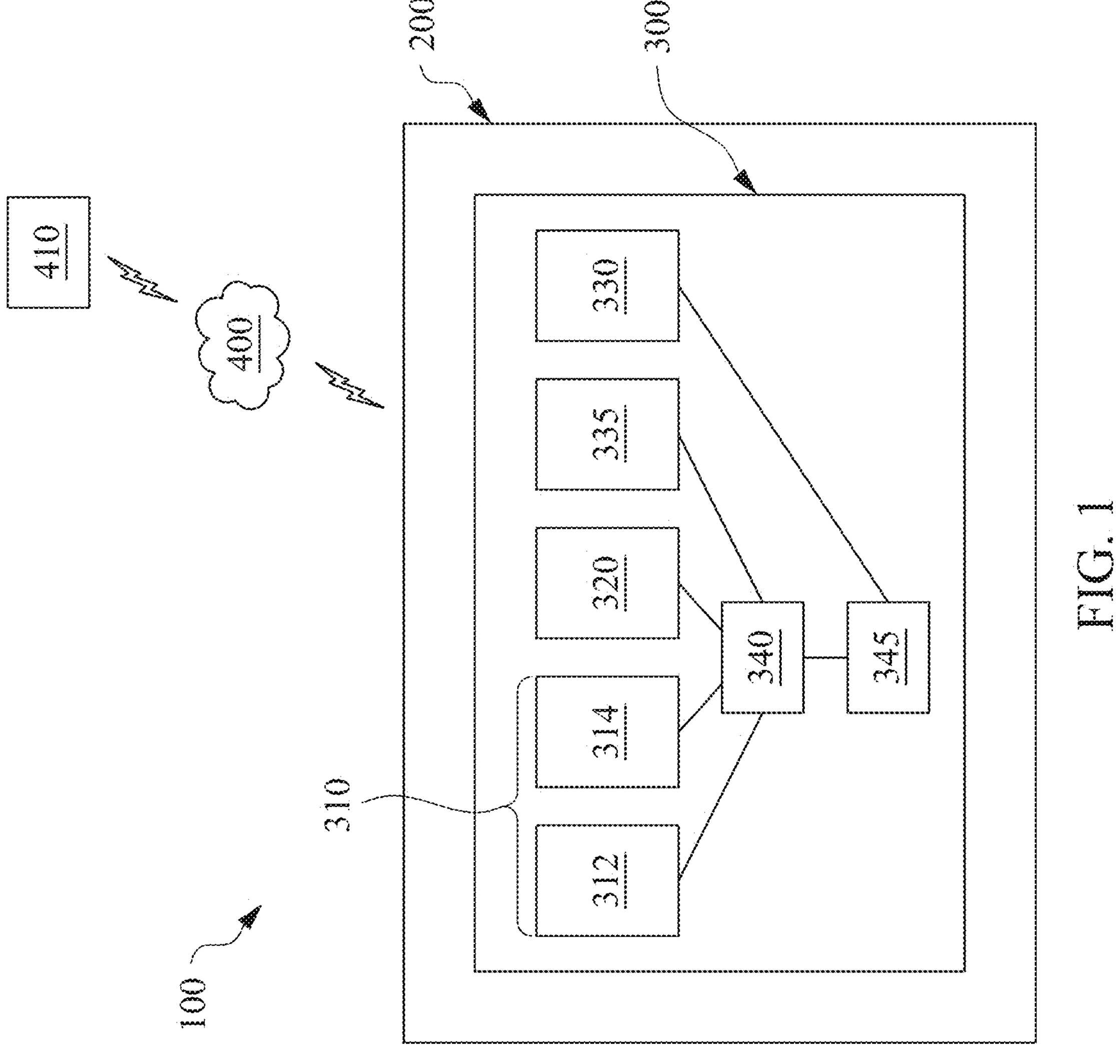
FIG. 1 is a schematic block diagram of an integrated nozzle cleaning apparatus for automatically cleaning nozzles of a gas supply system, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. System may be otherwise oriented (rotated 90 degrees or at other orientations) and the spatially relative descriptors used herein may likewise be interpreted accordingly.

In an automated semiconductor integrated circuit fabrication facility (commonly referred to as a "fab"), front opening unified pods (FOUPs) are transported between stations via an automated material handling system (AMHS) such as an overhead transport (OHT) or an overhead conveyor (OHC) system. Examples of a station include a work station where a processing tool for depositing or etching films is located or an overhead storage station (e.g., a stocker or an overhead buffer) where FOUPs are temporarily stored. A significant amount of time is normally incurred in transporting FOUPs from station to station, particularly if the fab is large or if there are numerous steps in completing the wafer processing. Because FOUPs are typically not hermetically sealed, to preserve the controlled environments FOUPs are often purged with gas (e.g., a nitrogen gas, extreme clean dry air (XCDA) or some other inert gases such as helium, argon or the like) at a gas purge station during the interim storage period. When purging, a FOUP is positioned with respect to a load port containing a gas supply system. The gas supply system flows a purge gas into the FOUP to flush out oxygen, moisture and other harmful contaminants that damage wafer surfaces. The gas supply system includes nozzles configured to be connectable to gas inlets of the FOUP through which the purge gas from the gas supply system enters into the FOUP. In some instances, the gas supply system is incorporated into an intermediate process station such as a stocker, an overhead buffer or an OHT system.

Nozzles of the gas supply system are often exposed to the clean room atmosphere in the fab, and as time passes, nozzles become contaminated by the accumulation of organic and/or inorganic airborne molecular contaminants. When gases are purged into the FOUP through contaminated nozzles, contaminant particles on the nozzles are introduced into the FOUP and increase the risk of damage to the wafers. Nozzles are regularly cleaned and maintenance is provided to remove environmental contaminants in order to help maintain a contamination-free environment in the FOUP. In some instances, cleaning of nozzles involves manually vacuuming nozzles with a vacuum cleaner and wiping nozzles with a cleaning brush. Several problems are associated with the manual cleaning. A human operator is only able to clean one nozzle at a time, cleaning multiple nozzles in a gas supply system by a human operator thus is tedious, time consuming, inefficient, and inconsistent. Cleaning by a human operator also increases a risk of contamination and a risk of human error. Furthermore, to clean nozzles of a gas supply system equipped in an overhead storage station, a human operator performing the cleaning task needs climb to a high position, which increases a risk of falling from a ladder.

The present disclosure describes an integrated nozzle cleaning apparatus including a carrier and an automated nozzle cleaning system placed inside the carrier for automatically cleaning nozzles of a gas supply system. The automated nozzle cleaning system is configured to engage to gas inlets of the carrier. When the carrier is loaded onto a load port containing a gas supply system, the carrier is positioned such that gas inlets of the carrier are mated in a sealed manner to respective nozzles of the gas supply system, and thus allows the automated nozzle cleaning system to remove contaminant particles on the nozzles through corresponding gas inlets of the carrier. By avoiding manual cleaning processes, the integrated nozzle cleaning apparatus provides a reliable means for automatically cleaning nozzles of the gas supply system. In addition, the integrated nozzle cleaning apparatus is capable of cleaning multiple nozzles simultaneously, and thus helps to increase manufacturing efficiency and reduces manufacturing costs. Furthermore, any wafer carrier commonly used in the fab is usable as the carrier to transport the automated nozzle cleaning system in the integrated nozzle cleaning apparatus. The automated nozzle cleaning system can be retrofitted to a wafer carrier. Modification to the fab infrastructure is avoided.

FIG. 1 is a schematic block diagram of an integrated nozzle cleaning apparatus 100 for automatically cleaning nozzles of a gas supply system, in accordance with some embodiments. Integrated nozzle cleaning apparatus 100 includes a carrier 200 and an automated nozzle cleaning system 300 within carrier 200. In some embodiments, automated nozzle cleaning system 300 includes a nozzle cleaning unit 310, at least one monitoring device 320, at least one imaging device 330, a modular sensor 335, a power supply 340, and a controller 345.

Nozzle cleaning unit 310 is capable of cleaning nozzles of a gas supply system. Nozzle cleaning unit 310 includes a vacuum 312 operable to remove contaminant particles from nozzles, and at least one cleaning brush 314 each operable to brush residue contaminant particles adhering to a surface of a corresponding nozzle after vacuum cleaning. In some embodiments, each cleaning brush 314 is made of a soft and non-abrasive material. In some embodiments, each cleaning brush 314 is a particle-free cotton brush usable to clean semiconductor processing equipment. Advantageously, using a particle-free cleaning brush helps to ensure that the cleaning procedure does not introduce additional contaminate particles to the nozzles.

Monitoring device 320 is operable to measure the number of contaminant particles within the purge gas stream introduced into carrier 200. In some embodiments, monitoring device 320 is a particle counter. The particle counter measures the amount of light scattered by the particles in the gas sample that is drawn through the particle counter and produces an output signal that is characteristic of one or more parameters of the particles, such as size and number of particles in a size range. In some embodiments, the particle counter is a programmable multi-channel airborne particle counter capable of measuring 0.2-0.5 micron meter (μm) particles.

At least one imaging device 330 is operable to capture images of a corresponding nozzle after the cleaning operation is completed. In some embodiments, the at least one imaging device 330 is a laser scanning microscope. In some embodiments, the at least one imaging device 330 is a charge-coupled device (CCD) camera.

Modular sensor 335 is operable to measure temperature and humidity of the purge gas flowing into carrier 200 after nozzle cleaning. The temperature and humidity data are usable to determine whether nozzles of the gas supply system are working properly after nozzle cleaning.

Power supply 340 is usable to provide power to various components of automated nozzle cleaning system 300 for operating automated nozzle cleaning system 300. In some embodiments, power supply 340 is a battery. In some embodiments, power supply 340 also includes a power conversion unit which is a direct current (DC) to alternating current (AC) converter and/or a DC to DC converter.

Controller 345 includes one or more processor and/or memory components to store and execute software program instructions. Controller 345 is operable to govern functioning of various components of automated nozzle cleaning system 300. In some embodiments, controller 345 provides control signals to initiate, regulate, and terminate cleaning operation sequences via power supply 340. In some embodiments, controller 345 communicates wirelessly, for instance, via a communication network 400, to transmit data and control commands to a computer integrated manufacturing (CIM) system 410. CIM system 410 includes a recipe management system designed for managing and maintaining various processing recipes associated with various processing tools, various products, wafer carrier purging operations, and cleaning operations including nozzle cleaning operation.

Figure 2A:
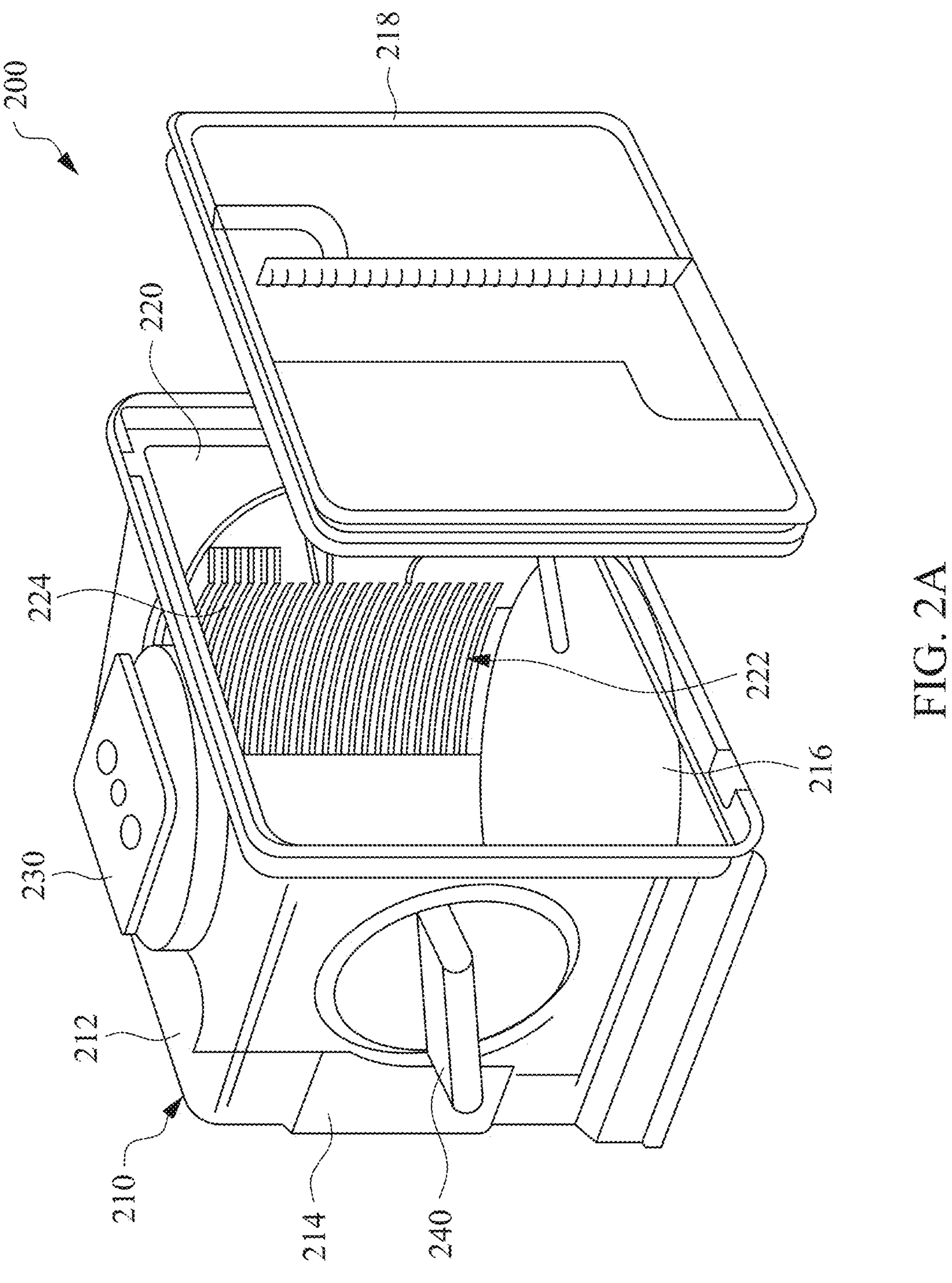
FIG. 2A is a perspective view of a carrier usable in an integrated nozzle cleaning apparatus, in accordance with some embodiments.
Figure 2B:
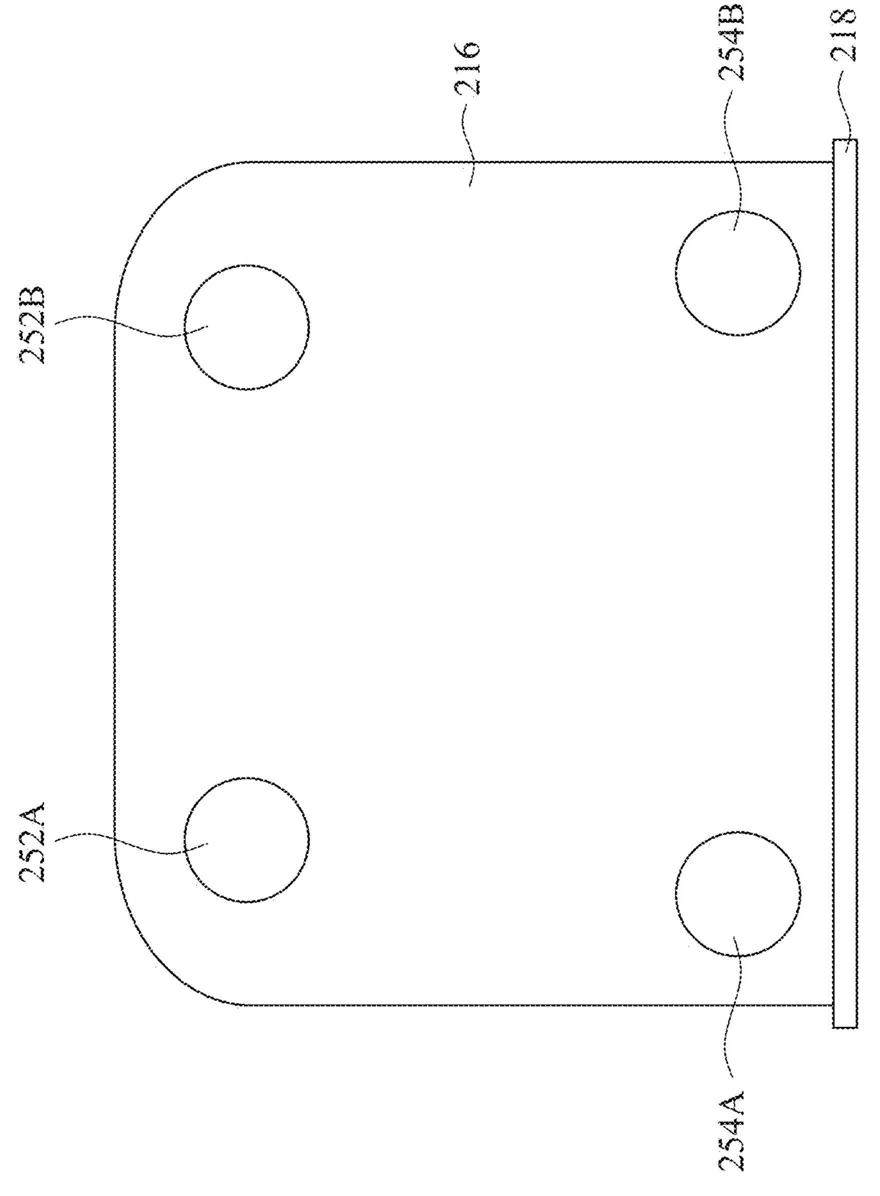
FIG. 2B is a top view of a bottom of the carrier of FIG. 2A.

FIGS. 2A-2B are views of a carrier 200 usable in an integrated nozzle cleaning apparatus 100, in accordance with some embodiments. FIG. 2A is a perspective view of carrier 200, and FIG. 2B is a top view of a bottom plate 216 of carrier 200. Carrier 200 is configured to be connectable to nozzles of a gas supply system that purges gas to a wafer carrier. In some embodiments, carrier 200 is a wafer carrier for transporting wafers to various processing or storage stations. In some embodiments, the wafer carrier is a FOUP configured to contain 300 millimeter (mm) wafer. In some embodiments, the wafer carrier is a FOUP configured to contain larger or smaller diameter wafers.

Referring to FIG. 2A, carrier 200 includes a housing 210 that has a top plate 212, side plates 214, a bottom plate 216, a rear plate (not shown), and a front plate 218, which is also referred to as a front opening door 218. Housing 210 encloses a main compartment 220 in order to provide a controlled environment for excluding various contaminant particles.

A supporting structure 222 is attached to the inner surface of sidewalls 214 of housing 210 for fixing the automated nozzle cleaning system in carrier 200. In some embodiments, supporting structure 222 is a wafer cassette including a plurality of slots 224 adapted to hold wafers in place. Slots 224 are defined by a plurality of vertically spaced surfaces, and each slot 224 is configured to support a peripheral portion on opposite sides of a wafer. In some embodiments, the wafer cassette includes twenty-five slots 224 and thus is capable of storing up to twenty-five wafers at a time. In some embodiments, the wafer cassette is capable of storing more or less than twenty-five wafers at a time. In some embodiments, supporting structure 222 includes a single slot designed for fixing the automated nozzle cleaning system (not shown) in carrier 200.

On top of housing 210, an adaptor 230 is provided for gripping carrier 200 by a transportation arm (not shown) of an overhead transport system to facilitate the transportation of carrier 200 between different stations in the fab. In some embodiments, housing 210 also includes handles 240 on both sides of housing 210 for ease of transportation by human operators.

Housing 210 includes at least one gas inlet adapted to engage with a corresponding nozzle (not shown) of a gas supply system to convey gas from the gas supply system to the interior of carrier 200 and at least one gas outlet adapted to couple to a vacuum line to remove gas from carrier 200. In some embodiments and as shown in FIG. 2B, a bottom plate 216 of housing 210 is equipped with multiple gas inlets 252A, 252B at the back side of housing 210 opposite front opening door 218 and multiple gas outlets 254A, 254B at the front side of housing 210. Different number and positioning of gas inlets and gas outlets are contemplated and within the scope of the present disclosure.

Figure 3A:
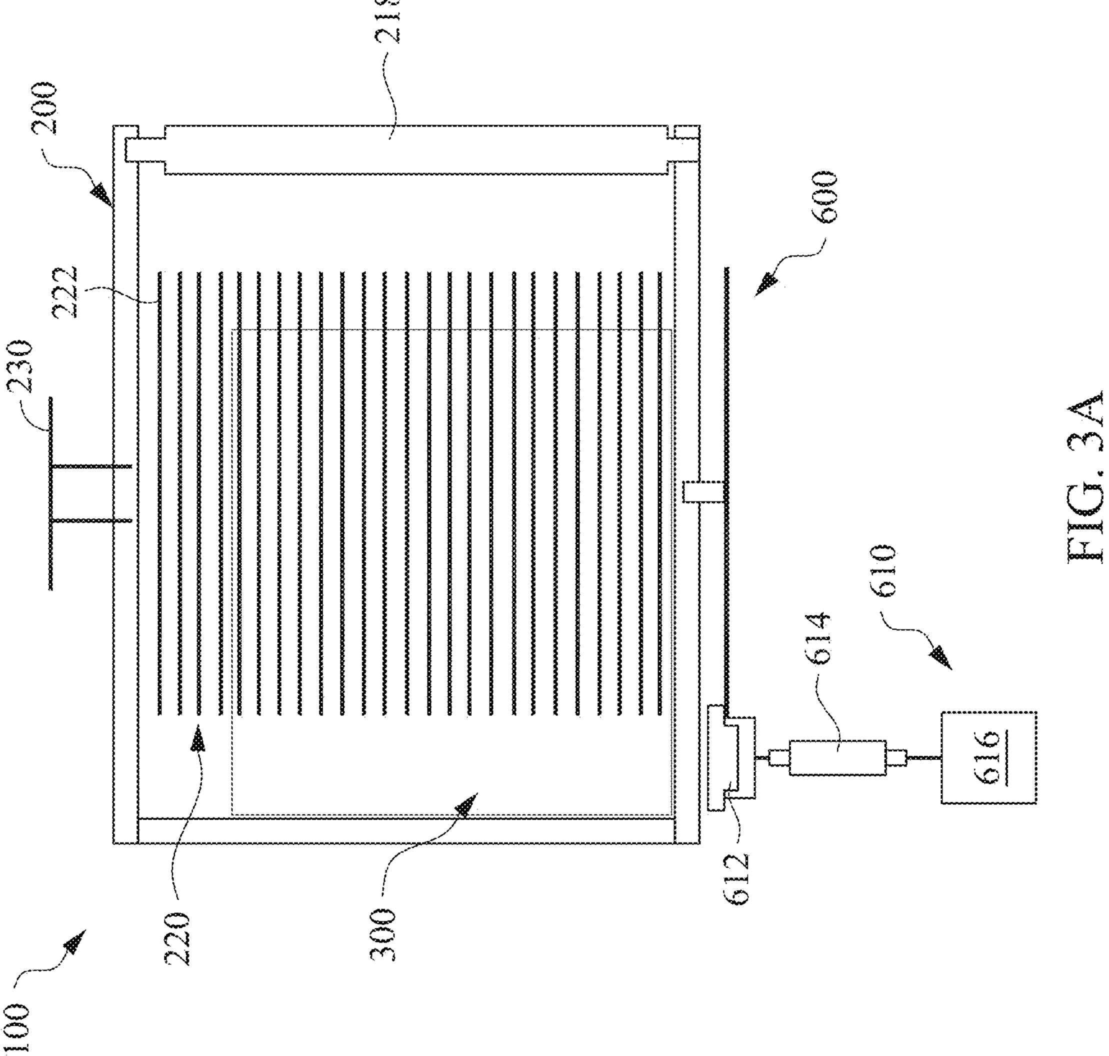
FIG. 3A is a schematic side view of an integrated nozzle cleaning apparatus for automatically cleaning nozzles of a gas supply system, in accordance with some embodiments.
Figure 3B:
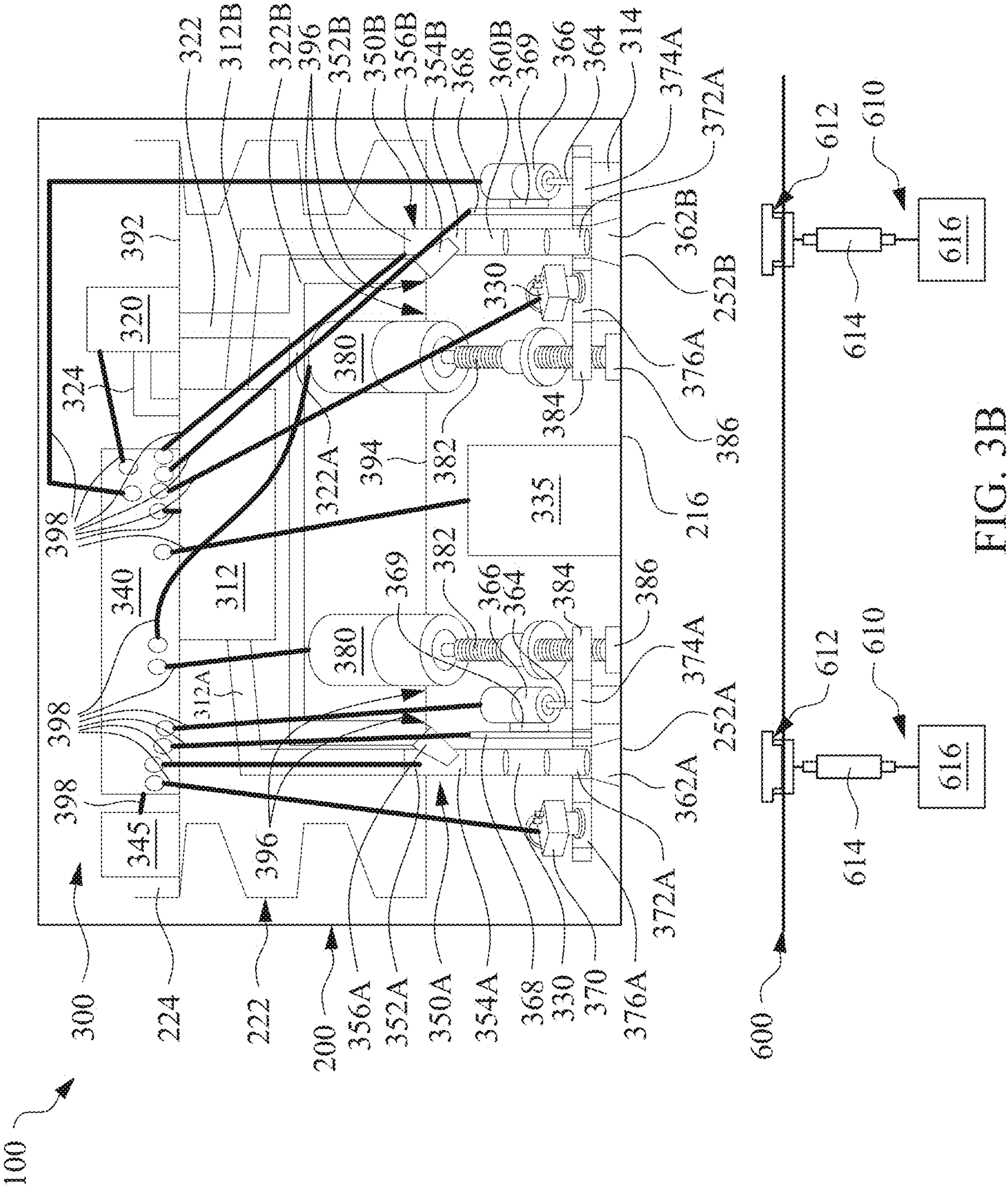
FIG. 3B is a schematic front view of the integrated nozzle cleaning apparatus of FIG. 3A.

FIGS. 3A and 3B are views of integrated nozzle cleaning apparatus 100 for automatically cleaning nozzles 612 of a gas supply system 610, in accordance with some embodiments. FIG. 3A is a schematic side view of integrated nozzle cleaning apparatus 100, and FIG. 3B is a schematic front view of integrated nozzle cleaning apparatus 100.

Referring to FIGS. 3A and 3B, integrated nozzle cleaning apparatus 100 includes carrier 200 and automated nozzle cleaning system 300 within carrier 200. Carrier 200 is configured to be held by a load port 600 containing gas supply system 610 that is operable to perform a gas purge to a wafer carrier. The details of carrier 200 usable in integrated nozzle cleaning apparatus 100 are described with respect to FIGS. 2A and 2B. In some embodiments, gas supply system 610 purges nitrogen gas, clean dry air (CDA, hydrocarbons (HC)<100 ppb, $H_2O$<100 ppb) or extreme clean dry air (XCDA) into the wafer carrier. In some embodiments, CDA contains less than 100 parts per billion (ppb) each of hydrocarbons and moisture, and XCDA contains less than 1 ppb of moisture, less than 10 parts per trillion (ppt) of volatile bases, and less than 1 ppt of all other contaminants. In some embodiments, gas supply system 610 includes filters 614 connected to respective nozzles 612. Filters 614 are operable to filter the purge gas supplied by a gas source 616 in gas supply system 610, to help remove contaminant particles from the purge gas. When integrated nozzle cleaning apparatus 100 is loaded onto load port 600, integrated nozzle cleaning apparatus 100 is positioned such that gas inlets 252A and 252B of carrier 200 are coupled to respective nozzles 612 of gas supply system 610, thus allowing automated nozzle cleaning system 300 to perform nozzle cleaning through gas inlets 252A and 252B of carrier 200.

Automated nozzle cleaning system 300 is placed inside carrier 200 and is configured to remove contaminant particles from each nozzle 612 of gas supply system 610 through a corresponding gas inlet 252A, 252B of carrier 200.

Referring to FIG. 3B, automated nozzle cleaning system 300 includes a nozzle cleaning unit 310 (FIG. 1) operable to help remove contaminant particles from nozzles 612 of gas supply system 610, a monitoring device 320 operable to detect and count contaminant particles ejected from nozzles 612 of gas supply system 610, at least one imaging device 330 operable to capture images or videos of a corresponding nozzle 612 of gas supply system 610, a modular sensor 335 operable to measure temperature and humidity of purge gas flowing into carrier 200, a power supply 340 operable to supply power to various components of automated nozzle cleaning system 300, and a controller 345 adapted to control operations of various components of automated nozzle cleaning system 300.

In some embodiments, nozzle cleaning unit 310 (FIG. 1) includes a vacuum 312, operable to help remove contaminant particles from nozzles 612, and at least one cleaning brush 314 operable to scrub residue particles off a corresponding nozzle 612 after each vacuuming operation.

Depending on the number of gas inlets provided in carrier 200, vacuum 312 includes one or more hoses 312A/312B for engaging vacuum 321 to the gas inlet(s) of carrier 200. In some embodiments and when carrier 200 contains two gas inlets 252A, 252B, vacuum 312 is provided with a first hose 312A and a second hose 312B. First hose 312A of vacuum 312 is coupled to a first end 352A of a first connector 350A. A second end 354A of first connector 350A is coupled to a first connection pipe 360A which is in turn coupled to a first suction cup 362A. First suction cup 362A is configured to form an interface with first gas inlet 252A of carrier 200, and thus form a sealed connection with first gas inlet 252A during vacuuming and monitoring operations. In a similar manner, second hose 312B of vacuum 312 is coupled to a first end 352B of a second connector 350B. A second end 354B of second connector 350B is coupled to a second connection pipe 360B which is in turn coupled to a second suction cup 362B. Second suction cup 362B is configured to form an interface with second gas inlet 252B of carrier 200, and thus form a sealed connection with second gas inlet 325B during vacuuming and monitoring operations. In some embodiments, suction cups 362A, 362B have a dimension greater than respective gas inlets 252A, 252B. In some embodiments, suction cups 362A, 362B comprise relatively soft rubber such as, for example, silicone or latex.

Also depending on the number of gas inlets provided in carrier 200, monitoring device 320 includes one or more inlet pipes coupled to connectors 350A, 350B. In some embodiments, monitoring device 320 includes a pipe 322 having a first intake pipe 322A coupled to a third end 356A of first connector 350A and a second intake pipe 322B coupled to a third end 356B of second connector 350B. Monitoring device 320 is coupled to a pump (not shown) of vacuum 312 through a pipe 324.

First suction cup 362A, first connection pipe 360A, second end 354A of first connector 350A, first end 352A of first connector 350A, and first hose 312A of vacuum 312 provide a first gas flow path from first gas inlet 252A to vacuum 312. First suction cup 362A, first connection pipe 360A, second end 354A of first connector 350A, third end 356A of first connector 350A, and first intake pipe 322A of pipe 322 provide a second gas flow path from first gas inlet 252A to monitoring device 320. In a similar manner, second suction cup 362B, second connection pipe 360B, second end 354B of second connector 350B, first end 352B of second connector 350B, and second hose 312B of vacuum 312 provide a first gas flow path from second gas inlet 252B to vacuum 312. Second suction cup 362B, second connection pipe 360B, second end 354B of second connector 350B, third end 356B of second connector 350B, and second intake pipe 322B of pipe 322 provide a second gas flow path from second gas inlet 252B to monitoring device 320. When vacuum 312 is turned on, vacuum 312 sucks contaminant particles from respective nozzles 612 via respective first gas flow paths. When monitoring device 320 is turned on, monitoring device 320 collects contaminant particles removed from nozzles 612 via corresponding second gas flow paths and provides information as to the number of contaminant particles collected.

In some embodiments, each of first connector 350A and second connector 350B is a controllable three-way valve. The three-way valves assume a first position in which the three-way valves couple hose 312A, 312B of vacuum 312 to corresponding connection pipes 360A, 360B for performing vacuuming operation through the first gas flow path. When monitoring device 320 is turned on to measure the level of contaminant particles, the three-way valves are switched to a second position in which the three-way valves couple intake pipes 322A, 322B of monitoring device 320 to corresponding connection pipes 360A, 360B for performing monitoring operation through the second gas flow path.

A plurality of cleaning brushes 314 are provided to brush residue contaminant particles off corresponding nozzle surfaces 612. Each cleaning brush 314 is driven by a driving unit including a rotary motor 366 and a linear motor 368 placed side by side. In some embodiments, each cleaning brush 314 is attached to a shaft 364 which is connected to rotary motor 366. Rotary motor 366 is configured to rotate cleaning brush 314 around an axis. Rotary motor 366 is coupled to linear motor 368 through a joint member 369. One end of linear motor 368 is attached to, and fixed by, a function switching plate described below. Linear motor 368 is configured to move cleaning brush 314 in a forward or a backward direction. In some embodiments, linear motor 368 is a rod motor. During a cleaning operation, linear motor 368 drives rotary motor 366 so as to move cleaning brush 314 forwardly through gas inlet 252A or 252B. Cleaning brush 314 is moved by a predetermined distance until cleaning brush 314 touches nozzle 612 of gas supply system 610. Rotary motor 366 then rotates shaft 364 which in turn rotates cleaning brush 314 across surface of nozzle 612 to brush off any residue contaminant particles remained on nozzle 612 after each vacuuming operation. After a predetermined time interval, linear motor 368 drives rotary motor 366 to retract cleaning brush 314 back into carrier 200 and return the cleaning brush 314 to the original position.

Automated nozzle cleaning system 300 further includes function switching plates 370 on opposite sides of carrier 200 to engage nozzle cleaning devices (e.g., vacuum 312, cleaning brushes 314) to corresponding gas inlets 252A, 252B of carrier 200 via rotation. Each function switching plate 370 is attached to a shaft 382 by a fixing structure 384. In some embodiments, fixing structures 384 is an anchoring clamp. One end of each shaft 382 is anchored to bottom plate 216 of carrier 200 by another fixing structure 386. In some embodiments, fixing structure 386 is a supporting bracket. The other end of each shaft 382 is connected to a motor 380 which controls the movement of shaft 382.

Figure 4:
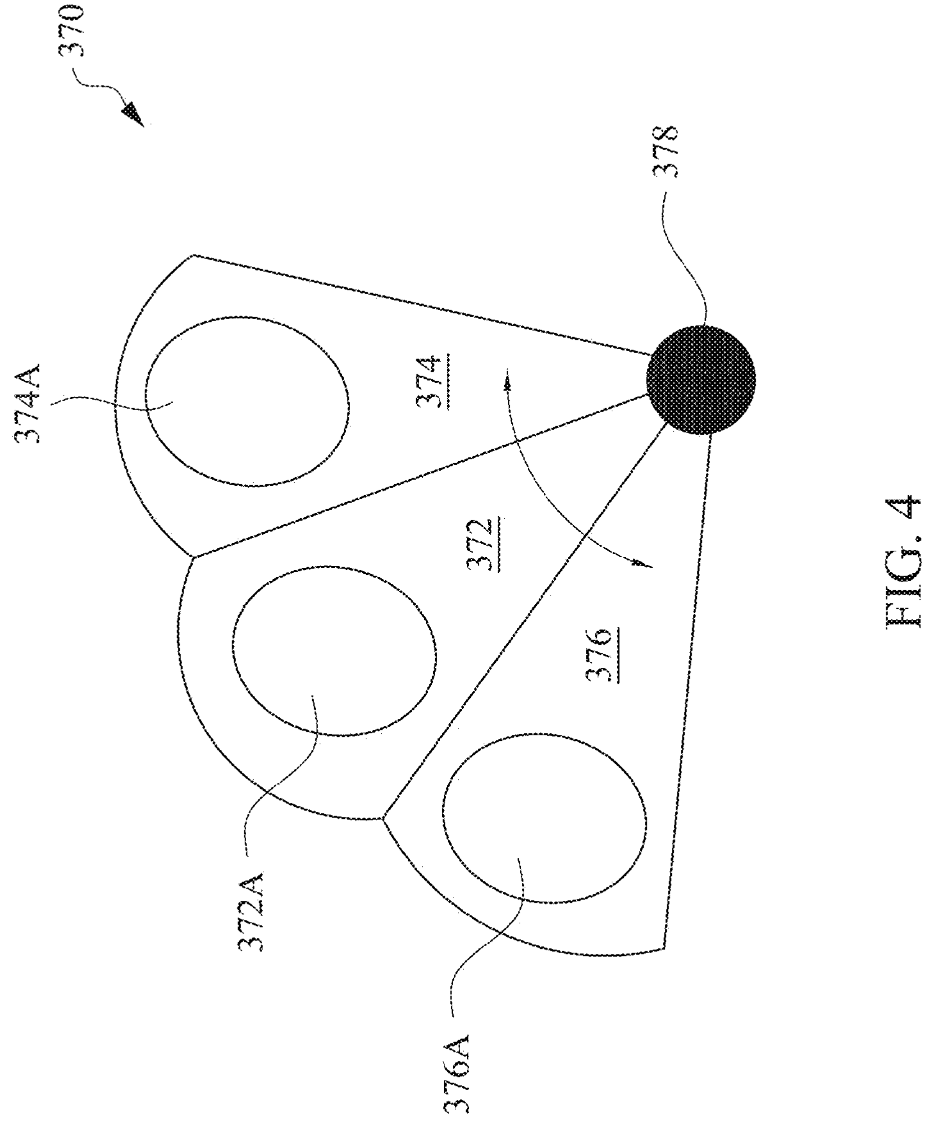
FIG. 4 is a top view of a function switching plate usable in an integrated nozzle cleaning apparatus, in accordance with some embodiments.

FIG. 4 is a top view of one of function switching plates 370, in accordance with some embodiments. Referring to FIG. 4, in some embodiments, each function switching plate 370 is fan-shaped having a middle section 372 positioned between a first end section 374 and a second end section 376 and is rotatable about an axis 378. Function switching plate 370 is shown in a fan shape for illustration purpose only, any other suitable shapes, such as, circular shape, are contemplated and within the scope of the present disclosure. Each function switching plate 370 contains a plurality of through holes configured to align with a corresponding gas inlet 252A/252B on rotation. A first through hole 372A is disposed at a portion of middle section 372 distal from axis 378, a second through hole 374A is disposed at a portion of first end section 374 distal from axis 378, and a third through hole 376A is disposed at a portion of second end section 376 distal from axis 378. In some embodiments, each through hole 372A, 374A, 376A is located a same distance from axis 378.

As shown in FIG. 3B, in some embodiments, first through hole 372A is configured to hold a connection pipe 360A/360B and to align with a corresponding gas inlet 252A, 252B of carrier 200 when function switching plate 370 is at an initial position, thereby engaging vacuum 312 and monitoring device 320 to the corresponding gas inlet 252A, 252B when function switching plate 370 is at an initial position. In some embodiments, second through hole 374A is configured to hold a cleaning brush 314 and to align with the corresponding gas inlet 252A, 252B of carrier 200 after function switching plate 370 is rotated in a first rotational direction by the motor 380 to a first positon, thereby engaging cleaning brush 314 to the corresponding gas inlet 252A, 252B at the first position. In some embodiments, third through hole 376A is configured to hold an imaging device 330 and to align with the corresponding gas inlet 252A, 252B of carrier 200 after function switching plate 370 is rotated in a second rotational direction by motor 380 to a second position, thereby engaging imaging device 330 to the corresponding gas inlet 252A, 252B at the second position. The second rotational direction is opposite to the first rotational direction. In some embodiments, the first rotational direction is a counter-clockwise direction, and the second rotational direction is a clockwise direction. In some embodiments, the first rotational direction is a clockwise direction, and the second rotational direction is a counter-clockwise direction.

Returning to FIG. 3B, automated nozzle cleaning system 300 further includes an upper mounting plate 392 and a lower mounting plate 394 to support and/or secure various components of automated nozzle cleaning system 300. In some embodiments, each mounting plate 392, 394 is dimensioned such that peripheral portions on opposing sides of each mounting plate 392, 394 are held by one slot 224 of the plurality slots 224 of supporting structure 222. In some embodiments, each mounting plate 392, 394 has the same size and shape as a wafer being transported by a wafer carrier. In some embodiments, each mounting plate 392, 394 has a circular shape. In some embodiments, each mounting plate 392, 394 is made of stainless steel.

In some embodiments, upper mounting plate 392 is adapted to support vacuum 312, monitoring device 320, power supply 340, and controller 345. In some embodiments, monitoring device 320, power supply 340, and controller 345 are mounted on top of upper mounting plate 392. In some embodiments, vacuum 312 is attached to a bottom of upper mounting plate 392 by an attachment (not shown). Any suitable attachment such as a screw, a nut and bolt, a clamp, or the like is usable. In some embodiments, vacuum 312 is attached to upper mounting plate 392 by a screw.

In some embodiments, lower mounting plate 394 is adapted to secure connectors 350A, 350B and motors 380. In some embodiments, through-holes 396 are formed in lower mounting plate 394 for receiving and securing connectors 350A, 350B and motors 380.

Modular sensor 335 is placed on bottom plate 216 of carrier 200 and is positioned in close proximity to gas inlets 252A and 252B. Modular sensor 335 is operable to measure humidity and temperature of the purge gas flowing into carrier 200.

Power supply 340 is electrically communicated with various components in automated nozzle cleaning system 300 including vacuum 312, monitoring device 320, imaging devices 330, modular sensor 335, connectors 350A and 350B, motors 366, 368 and 380, and controller 345 through electrically conductive wires 398, or some other electrical connection.

FIG. 5 is a flow chart of a method 500 for automatically cleaning nozzles 612 of a gas supply system 610 using integrated nozzle cleaning apparatus 100, in accordance with some embodiments. The description of method 500 uses integrated nozzle cleaning apparatus 100 described with respect to FIGS. 2A-4. In some embodiments, method 500 is usable with a different nozzle cleaning apparatus. In some embodiments, additional processes are performed before, during, and/or after the method 500 in FIG. 5, and that some of processes described herein are replaced or eliminated in some embodiments.

In operation 502, an integrated nozzle cleaning apparatus 100 including a carrier 200 and an automated nozzle cleaning system 300 placed therein is loaded onto a load port 600 containing a gas supply system 610 using an AMHS such as an OHT system (not shown). Carrier 200 is positioned such that gas inlets 252A, 252B of carrier 200 engage with respective nozzles 612 of gas supply system 610. Before cleaning operation starts, respective function switching plates 370 are placed at an initial position where first through holes 372A of function switching plates 370 are aligned with respective gas inlets 252A, 252B.

In operation 504, CIM system 410 identifies carrier 200, for example, by scanning an identification tag of carrier 200. The identification tag contains carrier ID. In some embodiments, the identification tag also contains cleaning recipe related to nozzle cleaning operation sequences. In some embodiments, the identification tag is a barcode or radio-frequency identification (RFID).

In operation 506, upon reading a tag from carrier 200 indicating that integrated nozzle cleaning apparatus 100, not a regular wafer carrier containing wafers, is loaded onto load port 600, CIM system 410 sends a signal to gas supply system 610 which actuates nozzles 612 to reduce the flow rate of the purge gas entering into carrier 200 according to a nozzle cleaning recipe stored in the recipe management system. In some embodiments, the flow rate of the purge gas is reduced from a normal flow rate (e.g. about 13 liters/minute (L/min)) for normal carrier purging operation when wafers are present to about 3 L/min or lower for nozzle cleaning operation. The gas flow rate is maintained at the reduced rate during the entire nozzle cleaning operation. Performing nozzle cleaning operation at a reduced flow rate helps to conserve the use of purge gas and/or cooling water, which in turn helps to reduce the power consumption. Process cost thus is able to be kept low.

In operation 508, controller 345 sends a control signal to power supply 340 to activate vacuum 312. Vacuum 312 sucks particle contaminants from nozzles 612 into a container (not shown) in vacuum 312 through first gas flow paths including respective gas inlets 252A, 252B, suction cups 362A, 362B, connection pipes 360A, 360B, three-way connectors 350A, 350B, and hoses 312A, 312B. Vacuum 312 operates for a first predetermined period of time, then controller 345 sends a control signal to power supply 340 to deactivate vacuum 312. In some embodiments, the first predetermined period of time is set to be about 5 minutes (mins).

In operation 510, controller 345 sends a control signal to power supply 340 to activate motors 380. Motors 380 rotate respective shafts 382, which in turn rotate respective function switching plates 370 to a first position. At the first position, second through holes 374A of function switching plates 370 are aligned with respective gas inlets 252A, 252B. Cleaning brushes 314 are thus aligned with respective nozzles 612. In some embodiments, function switching plates 370 are rotated in a counter-clockwise direction.

In operation 512, controller 345 sends a control signal to power supply 340 to activate linear motors 368. Linear motors 368 moves respective rotary motors 366 in a forward direction which in turn move respective cleaning brushes 314 forward through respective gas inlets 252A, 252B until cleaning brushes 314 touch respective nozzles 612. Controller 345 then sends a control signal to power supply 340 to deactivate linear motors 368 and active rotary motors 366. Rotary motors 366 then rotate respective shafts 364 which in turn rotate respective cleaning brushes 314 across surfaces of respective nozzles 612 for a second predetermined period of time. Cleaning brushes 314 are operated to remove residue contaminant particles that remain on nozzles 612 after vacuuming. In some embodiments, the second predetermined period of time is set to be about 1 min. After the second predetermined period of time passes, controller 345 sends a control signal to power supply 340 to turn off rotary motors 366, and to turn on linear motors 368. Linear motors 368 drive respective rotary motors 366 in a backward direction which in turn move respective cleaning brushes 314 backward until respective cleaning brushes 314 are in the original position.

In operation 514, controller 345 sends a control signal to power supply 340 to activate motors 380. Motors 380 rotate respective shafts 382 which in turn rotate respective function switching plates 370 back to the initial position such that first through holes 372A of function switching plates 370 are aligned with respective gas inlets 252A, 252B.

In operation 516, controller 345 sends a control signal to power supply 340 to switch connectors 350A, 350B to the second position corresponding to the monitoring operation. Vacuum 312 and monitoring device 320 are subsequently turned on to measure a level of contaminant particles in the purge gas streams that flow in respective second gas flow paths. Second gas flow paths include corresponding gas inlets 252A, 252B, suction cups 362A, 362B, connection pipes 360A, 360B, connectors 350A, 350B and pipes 322. The data collected by monitoring device 320 is transmitted to controller 345.

In operation 518, controller 345 compares the level of contaminant particles measured by monitoring device 320 with a predetermined level to determine the cleanliness of respective nozzles 612. If the measured level is equal or less than the predetermined level, the condition for end of cleaning operations (i.e., vacuuming operation and brushing operation) is satisfied, and method 500 proceeds to operation 520. In some embodiments, the condition for ending the cleaning operations is satisfied when average size of particles is less than 0.3 μm, and amount of particles is less than 3 grams per cubic inch (3 $g/in^3$). If the measured level is greater than the predetermined level, controller 345 sends a signal to power supply 340 to turn off monitoring device 320 and to switch connectors 350A, 350B to the first position to repeat the vacuuming operation. Operations 508-518 are repeated until controller 345 determines that a level of contaminant particles in the purge gas stream detected by monitoring device 320 is equal to or lower than the predetermined level, and method 500 proceeds to operation 520.

In operation 520, controller 345 sends a control signal to power supply 340 to activate motors 380. Motors 380 rotate respective shafts 382 which in turn rotate respective function switching plates 370 to a second position. At the second position, third through holes 376A of function switching plates 370 are aligned with respective gas inlets 252A, 252B. Imaging devices 330 are thus aligned with respective nozzles 612. In some embodiments, function switching plates 370 are rotated in a clockwise direction. Function switching plates 370 are allowed to stay at the second position for a third predetermined period of time. In some embodiments, the third predetermined period of time is set to be about 1 min.

In operation 522, imaging devices 330 capture images or videos of respective nozzles 612.

In operation 524, controller 345 sends a control signal to power supply 340 to active modular sensor 335. Modular sensor 335 measures temperature and humidity of the purge gas flowing into carrier 200. If the temperature or humidity is higher than the set point value (e.g., the temperature is deviated about 2° C. from a normal operation temperature and the humidity is increased about 10% from a normal humidity), an alarm is triggered to indicate that gas supply system 610 is not working properly. In some embodiments, operation 524 is performed simultaneously with operation 522.

In operation 526, controller 345 sends a control signal to power supply 340 to activate motors 380. Motors 380 rotate respective shafts 382 which in turn rotate respective function switching plates 370 back to the initial position.

In operation 528, controller 345 sends a signal to CIM system 410 using wireless network 400 indicating cleaning sequences are complete. CIM system 410 sends a signal to AMHS to unload integrated nozzle cleaning apparatus 100 from load port 600.

To evaluate cleaning effect of integrated nozzle cleaning apparatus 100, in some embodiments, the images captured by imaging device 330 are compared with reference images obtained from manual cleaning by, for example, a human operation. In some embodiments, after nozzles are cleaned using integrated nozzle cleaning apparatus 100, a wafer carrier which contains a control wafer is loaded onto the load port. A normal gas purging operation is subsequently performed to purge interior of the wafer carrier. The surface conditions of control wafer before the normal gas purging operation and after the normal gas purging operation are checked and compared to determine whether there are any contaminant particles remained on nozzles after the automatic cleaning by integrated nozzle cleaning apparatus 100.

An aspect of this description relates to a method of cleaning a nozzle of a gas supply system. The method includes loading an apparatus including a carrier and an automated nozzle cleaning system in the carrier onto a load port containing a gas supply system. The automated nozzle cleaning system includes a first nozzle cleaning device, a second nozzle cleaning device and a monitoring device, and the carrier is positioned to enable a gas inlet of the carrier to be connected to a nozzle of the gas supply system. The method also includes vacuuming contaminant particles from the nozzle using the first nozzle cleaning device, mechanically removing the contaminant particles adhering to the nozzle off the nozzle using the second nozzle cleaning device, and measuring a level of the contaminant particles using the monitoring device. In some embodiments, the method further includes rotating a function switching plate to align the second nozzle cleaning device with the gas inlet of the carrier. In some embodiments, the method further includes actuating the nozzle to allow a purge gas flowing into the carrier through the gas inlet upon the loading of the apparatus. In some embodiments, the actuating of the nozzle includes reducing a flow rate of the purge gas for a normal purging operation to a flow rate of the purge gas for a cleaning operation. In some embodiments, the method further includes repeating the evacuating step, the mechanical removing step and the measuring step until a predetermined level of the contaminant particles is detected by the monitoring device.

An aspect of this description relates to a method of cleaning a nozzle. The method includes positioning a first hole of a function switching plate to engage a first cleaning device with the nozzle. The method further includes vacuuming the nozzle using the first cleaning device. The method further includes positioning a second hole of the function switching plate to engage a second cleaning device with the nozzle. The method further includes mechanically cleaning the nozzle using the second cleaning device. The method further includes measuring a level of contaminant particles in a gas stream emitted from the nozzle following the vacuuming and the mechanical cleaning. In some embodiments, the method further includes determining whether the level of contaminant particles in the gas stream satisfies a predetermined level. In some embodiments, the method further includes repeating, in response to a determination that the level of contaminant particles in the gas stream fails to satisfy the predetermined level, the positioning of the first hole and the vacuuming of the nozzle. In some embodiments, the method further includes capturing an image of the nozzle in response to a determination that the level of contaminant particles in the gas stream satisfies the predetermined level. In some embodiments, the method further includes positioning a third hole of the function switching plate to engage an imaging device with the nozzle, wherein the capturing the image of the nozzle is performed using the imaging device. In some embodiments, the method further includes measuring a temperature or a humidity of the gas stream from the nozzle. In some embodiments, the method further includes disengaging the function switching plate from the nozzle. In some embodiments, mechanically cleaning the nozzle includes mechanically cleaning the nozzle using at least one brush.

An aspect of this description relates to a method of cleaning a nozzle. The method includes reducing a flow rate of a gas stream emitted from the nozzle. The method further includes loading a cleaning apparatus on the nozzle, wherein the cleaning apparatus includes a functional switching plate, a first cleaning device, and a second cleaning device. The method further includes positioning a first hole of the function switching plate to engage the first cleaning device with the nozzle. The method further includes vacuuming the nozzle using the first cleaning device. The method further includes positioning a second hole of the function switching plate to engage the second cleaning device with the nozzle. The method further includes mechanically cleaning the nozzle using the second cleaning device. The method further includes measuring a level of contaminant particles in the gas stream following the vacuuming and the mechanical cleaning. The method further includes disengaging the cleaning apparatus from the nozzle in response to a determination that the level of the contaminant particles satisfies a predetermined level. In some embodiments, the method further includes positioning a third hole of the function switching plate to engage an imaging device with the nozzle prior to disengaging the cleaning apparatus from the nozzle. In some embodiments, the method further includes capturing an image of the nozzle using the imagining device. In some embodiments, the method further includes repeating the vacuuming and the mechanical cleaning of the nozzle in response to a determination that the level of the contaminant particles fails to satisfy the predetermined level. In some embodiments, reducing the flow rate of the gas stream is after the loading the cleaning apparatus on the nozzle. In some embodiments, the mechanically cleaning includes cleaning the nozzle using a brush for a predetermined period of time. In some embodiments, positioning the second hole of the functioning plate includes rotating the functioning plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning a nozzle, the method comprising:
- positioning a first hole of a function switching plate to engage a first cleaning device with the nozzle;
- vacuuming the nozzle using the first cleaning device;
- positioning a second hole, different from the first hole, of the function switching plate to engage a second cleaning device with the nozzle, wherein positioning the second hole comprises rotating the function switching plate;
- mechanically cleaning the nozzle using the second cleaning device; and
- measuring a level of contaminant particles in a gas stream emitted from the nozzle following the vacuuming and the mechanical cleaning.

2. The method of claim 1, further comprising determining whether the level of contaminant particles in the gas stream satisfies a predetermined level.

3. The method of claim 2, further comprising repeating, in response to a determination that the level of contaminant particles in the gas stream fails to satisfy the predetermined level, the positioning of the first hole and the vacuuming of the nozzle.

4. The method of claim 2, further comprising capturing an image of the nozzle in response to a determination that the level of contaminant particles in the gas stream satisfies the predetermined level.

5. The method of claim 4, further comprising positioning a third hole of the function switching plate to engage an imaging device with the nozzle, wherein the capturing the image of the nozzle is performed using the imaging device.

6. The method of claim 1, further comprising measuring a temperature or a humidity of the gas stream from the nozzle.

7. The method of claim 1, further comprising disengaging the function switching plate from the nozzle.

8. The method of claim 1, where mechanically cleaning the nozzle comprises mechanically cleaning the nozzle using at least one brush.

9. A method of cleaning a nozzle, the method comprising:
- reducing a flow rate of a gas stream emitted from the nozzle;
- loading a cleaning apparatus on the nozzle, wherein the cleaning apparatus includes a function switching plate, a first cleaning device, and a second cleaning device;
- positioning a first hole of the function switching plate to engage the first cleaning device with the nozzle;
- vacuuming the nozzle using the first cleaning device;
- positioning a second hole, different from the first hole, of the function switching plate to engage the second cleaning device with the nozzle, wherein positioning the second hole comprises moving the function switching plate;
- mechanically cleaning the nozzle using the second cleaning device;
- measuring a level of contaminant particles in the gas stream following the vacuuming and the mechanical cleaning; and
- disengaging the cleaning apparatus from the nozzle in response to a determination that the level of the contaminant particles satisfies a predetermined level.

10. The method of claim 9, further comprising positioning a third hole of the function switching plate to engage an imaging device with the nozzle prior to disengaging the cleaning apparatus from the nozzle.

11. The method of claim 10, further comprising capturing an image of the nozzle using the imaging device.

12. The method of claim 9, further comprising repeating the vacuuming and the mechanical cleaning of the nozzle in response to a determination that the level of the contaminant particles fails to satisfy the predetermined level.

13. The method of claim 9, wherein the reducing the flow rate of the gas stream is after the loading the cleaning apparatus on the nozzle.

14. The method of claim 9, wherein the mechanically cleaning comprises cleaning the nozzle using a brush for a predetermined period of time.

15. The method of claim 9, wherein positioning the second hole of the function switching plate comprises rotating the function switching plate.

16. A method of cleaning a nozzle, the method comprising:
- arranging a function switching plate at a first position where a first hole of the function switching plate is aligned with a vacuum;
- engaging the vacuum with the nozzle through the first hole;
- removing contaminant particles from the nozzle using the vacuum;
- moving the function switching plate to a second position where a second hole, different from the first hole, of the function switching plate is aligned with a brush;
- engaging the brush with the nozzle through the second hole;
- removing contaminant particles adhering to the nozzle using the brush;
- measuring a level of contaminant particles in a gas stream from the nozzle using a monitoring device;
- determining whether the level of contaminant particles satisfies a predetermined level; and
- in response to a determination that the level of contaminant particles fails to satisfy the predetermined level, repeating the removing of contaminant particles from the nozzle using the vacuum.

17. The method of claim 16, further comprising capturing an image of the nozzle using an imaging device in response to a determination that the level of contaminant particles satisfies the predetermined level.

18. The method of claim 17, further comprising moving the function switching plate to a third position where a third hole of the function switching plate is aligned with the imaging device prior to capturing the image of the nozzle.

19. The method of claim 16, further comprising measuring a temperature or a humidity of the gas stream from the nozzle.

20. The method of claim 16, wherein the brush is a particle-free brush.

* * * * *